United States Patent
Karasawa et al.

[11] Patent Number: 5,877,079
[45] Date of Patent: Mar. 2, 1999

[54] METHOD FOR MANUFACTURING A SEMICONDUCTOR DEVICE AND A METHOD FOR MOUNTING A SEMICONDUCTOR DEVICE FOR ELIMINATING A VOID

[75] Inventors: Kazuaki Karasawa, Kawasaki; Yasuhiro Takaki, Miyazaki, both of Japan

[73] Assignee: Fujitsu Limited, Kawasaki, Japan

[21] Appl. No.: 873,028

[22] Filed: Jun. 11, 1997

[30] Foreign Application Priority Data

Dec. 2, 1996 [JP] Japan .................. 8-321974

[51] Int. Cl.$^6$ .................................... H01L 21/44
[52] U.S. Cl. ................ 438/613; 438/615; 438/661
[58] Field of Search ................ 438/613, 615, 438/660, 661, 662, 663

[56] References Cited

U.S. PATENT DOCUMENTS

| | | | |
|---|---|---|---|
| 4,545,610 | 10/1985 | Lakritz et al. | 438/615 |
| 4,950,623 | 8/1990 | Dishon | 438/661 |
| 5,162,257 | 11/1992 | Yung | 438/661 |
| 5,175,125 | 12/1992 | Wong | 438/660 |
| 5,658,827 | 8/1997 | Aulicino et al. | 438/615 |

FOREIGN PATENT DOCUMENTS

| | | |
|---|---|---|
| 61-75531 | 4/1986 | Japan . |
| 63-90160 | 4/1988 | Japan . |
| 63-130258 | 6/1988 | Japan . |
| 63-226031 | 9/1988 | Japan . |
| 63-304655 | 12/1988 | Japan . |
| 1-278959 | 11/1989 | Japan . |
| 2-79453 | 3/1990 | Japan . |
| 3-82146 | 4/1991 | Japan . |
| 3-91254 | 4/1991 | Japan . |
| 3-208346 | 9/1991 | Japan . |
| 4-360557 | 12/1992 | Japan . |
| 5-226386 | 9/1993 | Japan . |
| 6-69387 | 3/1994 | Japan . |
| 6-275733 | 9/1994 | Japan . |
| 6-285622 | 10/1994 | Japan . |
| 7-22744 | 1/1995 | Japan . |

*Primary Examiner*—Kevin Picardat
*Attorney, Agent, or Firm*—Armstrong, Westerman, Hattori, McLeland & Naughton

[57] ABSTRACT

A method for manufacturing and mounting a semiconductor device in which a void in a bonding portion is eliminated. A material which is to be formed into a protruding electrode is placed on a semiconductor element. The protruding electrode material is heated in a depressurized atmosphere so as to be melted. Then, the protruding electrode material is heated in a pressurized atmosphere which provides a pressure greater than a pressure in said depressurized atmosphere. Finally, the protruding electrode material is cooled so as to be solidified while the pressurized atmosphere is maintained. The semiconductor device is mounted to a mount board after a surface layer is electroplated on an electrode of the mount board.

8 Claims, 6 Drawing Sheets

5,877,079

METHOD FOR MANUFACTURING A SEMICONDUCTOR DEVICE AND A METHOD FOR MOUNTING A SEMICONDUCTOR DEVICE FOR ELIMINATING A VOID

BACKGROUND OF THE INVENTION

1. Field of the Invention

The present invention relates to a method for manufacturing a semiconductor device and a method for mounting a semiconductor device and, more particularly, to a method for manufacturing a semiconductor device which has protruding electrodes such as a solder bump and a method for mounting such a semiconductor device to a mount board or circuit board.

2. Description of the Related Art

In order to achieve a high-speed operation of a computer, it is required to decrease a propagation delay in signal transmission. The path for transmitting signals includes a path provided inside a semiconductor element and a path provided outside the semiconductor element. Recently, a high-speed operation of signal transmission in the semiconductor element has been achieved. Thus, it is desired to decrease a propagation delay of signals generated in connecting parts provided outside semiconductor elements and a propagation delay generated in wiring parts of a mount board to which the semiconductor elements are mounted.

A flip chip bonding reduces the propagation delay of signals. In the flip chip bonding, a bump such as a solder bump, a gold bump or a conductive material bump is used for bonding a semiconductor element to a mount board or circuit board. Accordingly, the length of a wiring portion between the semiconductor device and the mount board is reduced, resulting in a reduction in the entire length of the wiring parts. Thus, the propagation delay of signals can be reduced since the delay of signals in the wiring parts is proportional to the length of the wire parts.

In order to achieve the flip chip bonding, solder bumps, for example, must be formed on at least one of the semiconductor element and the mount board. As a method for forming the solder bumps, a solder paste printing method, a solder ball method, a vapor deposition method, a transfer method and an electroplating method are known.

The vapor deposition method, the transfer method and the electroplating method have superiority in forming many fine bumps. For example, solder bumps can be formed on the electrodes of a semiconductor element by plating a solder material. The solder bumps thus formed are aligned with corresponding electrodes of a mounting board, and then the solder bumps are melted to bond the semiconductor element to the mounting board.

One of the problems of the flip chip bonding is a decrease in the strength of the soldered portion due to presence of a void in the soldered portion. Such void may expand during a mounting process of the semiconductor element to the mount board which may result in fracture of the soldered portion. The cause of formation of the void may be a gas being trapped in an area between the electrode and the solder in which area the electrode is insufficiently wet by the molten solder.

Conventionally, several methods have been suggested to eliminate a void in the soldered portion as mentioned below.

Japanese Laid-Open Patent Application No.61-75531 discloses a method in which a soldering operation is performed while a surface on which a solder is provided is slanted so that the soldering operation is progressed while a gas is pressed out by the flow of solder. However, this method is not applicable to fine bumps.

Japanese Laid-Open Patent Applications No.63-90160, No.3-82146 and No.6-275733 disclose a method for providing a passage (a through hole) through which a gas in a void can escape. Additionally, Japanese Laid-Open Patent Applications No.63-130258 and No.6-285622 disclose a method in which an oxidation layer of the solder is broken so as to prevent generation of a void. However, these methods are also not applicable to fine bumps.

Additionally, Japanese Laid-Open Patent Application No.3-208346 discloses a method for removing a gas in a void by sticking a needle into the solder. However, this method is not practical for fine bumps formed on a chip having a few thousands of terminals.

Further, Japanese Laid-Open Patent Application No.4-360557 discloses a method for soldering in a sealed manner which is not applicable to a fine solder bump. Japanese Laid-Open Patent Application No.5-226386 discloses a method for soldering while swinging which is not applicable to fine solder bumps provided with a fine pitch. Japanese Laid-Open Patent Application No.7-22744 discloses a method for pressing gas by applying a pressure to the solder. However, it is difficult in practice to apply a pressure to a fine bump.

In order to eliminate a void without the above-mentioned problems, Japanese Laid-Open Patent Applications No.63-226031, No.63-304655, No.2-79453, No.1-278959, No.3-91254 and No.6-69387 suggest a method for bonding without a void by using adhesive material. In this method, the adhesive material is provided to encircle a surface to be bonded. The adhesive material is rendered to be flowable under a low-pressure condition. Then, a high pressure is applied so as to flow the adhesive material inwardly and solidify the adhesive material.

In order to apply the above-mentioned method to a solder bump, the solder must be formed in a shape which encircles an electrode. However, it is difficult in practice to form the solder in such a shape to encircle a fine electrode having a diameter of a few tens of micrometers. Additionally, when a pitch is a few tens to a few hundreds of micrometers, there is a problem in that there is a high probability of short-circuiting adjacent electrodes.

As mentioned above, there is no publicly known method which is practically effective to reduce formation of voids in a solder bump. Accordingly, in a practical manufacturing process of a semiconductor device, a gas evacuation of a solder bump is performed in a relatively simple manner such as annealing in a vacuum condition or in an inert gas atmosphere, although it is recognized that such a method is not sufficient.

Another problem raised by the flip chip bonding is that a defective soldering occurs in a mounting process for mounting a semiconductor element to a mount board when an oxidation layer is present on a surface of a solder bump. Accordingly, the oxidation layer must be removed before a mounting process is performed. However, it is difficult to remove the oxidation layer under the vacuum condition or the inert gas atmosphere.

A further problem raised by the flip chip bonding is in that it is possible to lose an electrical contact between a solder and an electrode. That is, diffusion of solder material in the electrode may weaken the electrodes. Additionally, a fracture may occur in a metal compound formed by reaction of a solder material and an electrode material which metal compound is hard and brittle. Accordingly, a metal layer must be formed between the solder and the electrode so as to prevent diffusion of the solder material.

SUMMARY OF THE INVENTION

It is a general object of the present invention to provide an improved and useful method for manufacturing a semiconductor device in which the above-mentioned problems are eliminated.

It is an another object of the present invention to provide an improved and useful method for mounting a semiconductor device in which the above-mentioned problems are eliminated.

A more specific object of the present invention is to provide a method for manufacturing a semiconductor device in which formation of voids in a bonding portion is reduced.

Another object of the present invention is to provide a method for mounting a semiconductor device in which a reliable connection can be achieved between a semiconductor device and a mount board.

In order to achieve the above-mentioned objects, there is provided according to one aspect of the present invention a method for manufacturing a semiconductor device including a protruding electrode manufacturing process for manufacturing a protruding electrode which protrudes from a semiconductor element, the protruding electrode manufacturing process comprising:

a placing process for placing a material on the semiconductor element, the material being formed into the protruding electrode;

a depressurizing and heating process for heating the protruding electrode material in a depressurized atmosphere so as to melt the protruding electrode;

a pressurizing and heating process, subsequent to the depressurizing and heating process, for heating the protruding electrode material in a pressurized atmosphere which provides a pressure greater than a pressure in the depressurized atmosphere; and a pressurizing and cooling process, subsequent to the pressurizing and heating process, for cooling the protruding electrode material so as to solidify the protruding electrode material while the pressurized atmosphere is maintained.

According to the above-mentioned invention, the protruding electrode material is melted in the depressurized atmosphere so that a void which may be formed in the protruding electrode material is evacuated. Thereafter, the pressure applied to the protruding electrode material is increased so that the void in the protruding electrode material is compressed. Thus, the volume of the void in the protruding electrode material is reduced before the protruding electrode material is solidified. Since the volume of the void is reduced by a ratio of a pressure in the depressurized atmosphere to a pressure in the pressurized atmosphere, the void can be substantially eliminated by increasing the pressure ratio.

In one embodiment of the present embodiment, the protruding electrode material may be a solder so that a solder bump is formed as the protruding electrode.

Additionally, the placing process may include:

a forming process for forming the protruding electrode material on a plate which is made of a material having low bondability with the protruding electrode material; and a transferring process for transferring the protruding electrode material from the plate to the semiconductor element by heating the protruding electrode material while the protruding electrode material is brought into contact with the semiconductor element.

Accordingly, the protruding electrode material can be transferred to the semiconductor element with a high positional accuracy since the transfer is performed by positioning the semiconductor element with respect to the plate which carries the protruding electrode material.

The method for manufacturing a semiconductor device according to the present invention may further comprise an oxidation film removing process for removing an oxidation film formed on the protruding electrode, the oxidation film removing process being performed before the semiconductor element is bonded to a mount board or circuit board. Thus, bad bonding of the protruding electrode due to the oxidation film can be prevented when the semiconductor element is mounted to a mount board.

In the method for manufacturing a semiconductor device, the semiconductor element may include an electrode on which the material of the protruding electrode is placed by electroplating the material, the electrode of the semiconductor element having a surface layer formed by electroplating, the material of the protruding electrode and the surface layer being electroplated in consecutive electroplating processes.

According to the above-mentioned invention, since the protruding electrode is electroplated immediately after the surface layer is electroplated in consecutive electroplating processes, formation of an oxidation film on the electrode of the semiconductor element can be substantially eliminated. Thus, good wettability with respect to the protruding electrode material can be provided to the electrode of the semiconductor element. Thus, formation of a void can be eliminated when the protruding electrode is formed on the semiconductor element.

In one embodiment of the present invention, the surface layer may be formed by one of nickel or platinum.

Additionally, there is provided according to another aspect of the present invention a method for mounting a semiconductor device to a mount board having an electrode formed thereon, comprising:

a protruding electrode manufacturing process for manufacturing a protruding electrode which protrudes from a semiconductor element, the protruding electrode manufacturing process comprising:

a placing process for placing a material on the semiconductor element, the material being formed into the protruding electrode;

a depressurizing and heating process for heating the protruding electrode material in a depressurized atmosphere so as to melt the protruding electrode;

a pressurizing and heating process, subsequent to the depressurizing and heating process, for heating the protruding electrode material in a pressurized atmosphere which provides a pressure greater than a pressure in the depressurized atmosphere; and a pressurizing and cooling process, subsequent to the pressurizing and heating process, for cooling the protruding electrode material so as to solidify the protruding electrode material while the pressurized atmosphere is maintained, the method for mounting a semiconductor device further comprising:

a surface layer forming process for forming a surface layer on a surface of the electrode formed on the mount board, the surface layer forming process being performed subsequent to the protruding electrode manufacturing process in consecutive electroplating processes.

According to the above-mentioned invention, since the surface layer forming process is performed, formation of an oxidation film on the electrode of the mount board can be substantially eliminated. Thus, good wettability with respect to the protruding electrode material can be provided to the electrode of the mount board. Thus, formation of a void can be eliminated when the semiconductor device is mounted to the mount board.

In one embodiment of the present invention, the surface layer may be formed by one of nickel or platinum.

Other objects, features and advantages of the present invention will become more apparent from the following detailed description when read in conjunction with the accompanying drawings.

DETAILED DESCRIPTION OF THE PREFERRED EMBODIMENTS

A description will now be given with reference to FIGS. 1 to 5, of a first embodiment of the present invention.

FIGS. 1 to 5 are illustrations for explaining a manufacturing method of a semiconductor device according to the first embodiment of the present invention. The following description is focused on a process (a protruding electrode forming process) for forming an electrode protruding from a surface of a semiconductor device. It should be noted that processes used for a conventional method for manufacturing a semiconductor device can be used for processes other than the protruding electrode forming process in the method for manufacturing a semiconductor device according to the present invention.

In the present embodiment, a solder bump is used as the protruding electrode which is protrudingly formed on a semiconductor device.

The protruding electrode forming process generally includes a placing process, a depressurizing and heating process, a pressurizing and heating process and a pressurizing and cooling process which are performed in that order. A description will now be given, with reference to FIG. 4, of the placing process. The placing process is a process for placing a member (a solder) on a semiconductor element 2 which member will be formed into the protruding electrode.

Figure 5:
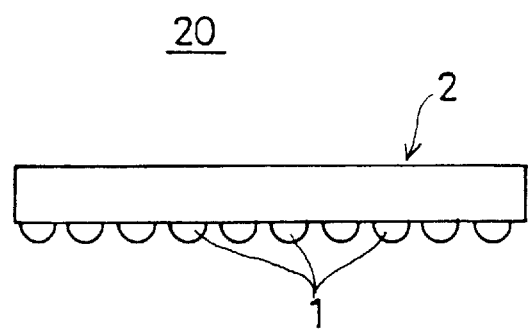
FIG. 5 is a side view of the semiconductor element after the solder bumps are formed.

In the placing process, a substrate 5 is prepared first as shown in FIG. 4-(A). The substrate 5 is provided with dimples 5a formed in positions corresponding to solder bumps 1 as shown in FIG. 5. A material which is selected for the substrate 5 has low wettability with respect to the solder material of the solder bumps 1. That is, the substrate 5 has low bondability with the solder.

A solder paste 6 is applied to the substrate 5 as shown in FIG. 4-(B). The solder paste 6 is made to fill in the dimples 5a by using a squeegee 7. FIG. 4-(C) shows a state where the solder paste 6 has filled in all of the dimples 5a. The solder paste 6 is composed of an organic paste material mixed with solder powder. The above-mentioned processes correspond to a formation process.

After the solder paste 6 has filled in the dimples 5a formed in the substrate 5, the solder paste 6 is heated so that the solder paste 6 in each of the dimples 5a is formed into a solder ball as shown in FIG. 4-(D). Then, the semiconductor element 2 is positioned above the substrate 5 as shown in FIG. 4-(E). The semiconductor element 2 is produced by a different process for manufacturing a semiconductor device. The positioning of the semiconductor element 2 is performed so that electrode pads 3 formed on the semiconductor element 2 are located directly above the corresponding dimples 5a formed in the substrate 5. It should be noted that the semiconductor element 2 is moved to a correct place by using a handling device.

Thereafter, the semiconductor element 2 is moved downwardly while the pads 3 face the corresponding dimples 5a, and finally the semiconductor element 2 makes contact with the substrate 5 as shown in FIG. 4-(F). In this state, the electrode pads 3 are buried in the solder paste 6 which has filled in the corresponding dimples 5a.

Thereafter, the assembly of the semiconductor element 2 and the substrate 5 is heated at a temperature above the melting point of the solder. By this heating process, the base paste material in the solder paste 6 evaporates, and the solder powder melts by the heat. The molten solder in the dimples 5a forms in a ball-like shape due to surface tension and adheres to the electrodes pads 3. Thus, the solder bumps 1 are formed on the electrode pads 3. That is, the solder (solder paste 6) provided in the substrate 5 is transferred from the substrate 5 to the semiconductor element 2. The above-mentioned processes correspond to a transfer process. FIG. 5 shows a semiconductor device 20 comprising the semiconductor element 2 provided with solder bumps 1 after the transfer process is completed.

As mentioned above, according to the present embodiment, the solder paste 6 (the member to be formed as the protruding electrode) is provided in the substrate 5 in the placing process. The substrate 5 and the semiconductor element are positioned relative to each other, and the solder 6 is transferred to the semiconductor element 2 so as to form the solder bump 1 on the semiconductor element 2. Thus, the solder bump 1 can be accurately positioned on the semiconductor element 2, and a highly reliable semiconductor device 20 can be produced.

The solder bumps 1 thus formed may include voids as mentioned above. Accordingly, in the present embodiment, the voids in the solder bumps 1 are substantially eliminated by sequentially performing the depressurizing and heating process, the pressurizing and heating process and the pressurizing and cooling process. A description will be given below of the depressurizing and heating process, the pressurizing and heating process and the pressurizing and cooling process.

Figure 7:
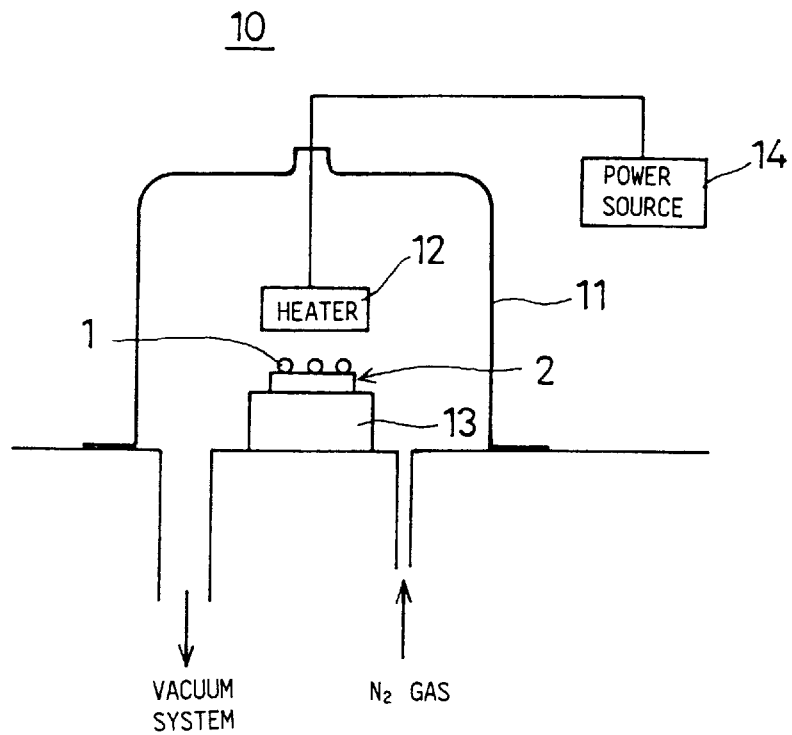
FIG. 7 is an illustration of a structure of an annealing apparatus used for forming the semiconductor apparatus.

FIG. 7 illustrates an annealing apparatus 10 which is used for the depressurizing and heating process, the pressurizing and heating process and the pressurizing and cooling process. The annealing apparatus 10 comprises a chamber 11 in which the semiconductor element 2 is processed; a heater 12 which heats the semiconductor element 2; a support table 13 on which the semiconductor element 2 is placed; and a power source 14 which supplies an electric power to the heater 12. A space inside the chamber 11 is connected to a vacuum system (not shown in the figure) including a vacuum pump and a nitrogen supplying unit (not shown in the figure).

In the depressurizing and heating process, the semiconductor element 2, which is provided with solder bumps 1, is put in the annealing apparatus 10. Thereafter, the vacuum system is operated so as to evacuate the chamber 11 from a normal pressure (P2) to a low pressure (P1). At the same time, an electric power is provided from the power source 14 to the heater 12 so as to heat the solder bumps 1 formed on the semiconductor element 2 at a temperature above the melting point of the solder.

Figure 1:
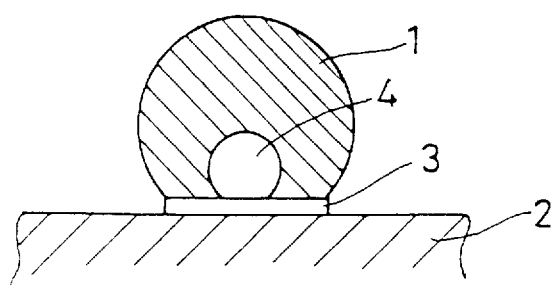
FIG. 1 is a cross-sectional view of a solder bump in a depressurizing and heating process.

FIG. 1 is a cross-sectional view of the solder bump 1 in the heating process. The solder bump 1 after the depressurizing and heating process is performed may contain a large void 4 as shown in FIG. 1. It should be noted that the solder bump 1 is melted by heating the solder bump 1 at a temperature above the melting point of the solder, however, the molten solder remains in the ball-like shape due to the surface tension.

After the depressurizing and heating process is completed, the pressurizing and heating process is performed. In the pressurizing and heating process, the pressure in the chamber 11 is increased from the low pressure (P1) to the normal pressure (P2). The solder bump 1 is heated in the normal pressure (P2: pressurized atmosphere). The temperature in the pressurizing and heating process is set to be substantially equal to the temperature in the depressurizing and heating process. That is, the temperature in the pressurizing and heating process is also above the melting point of the solder.

Figure 2:
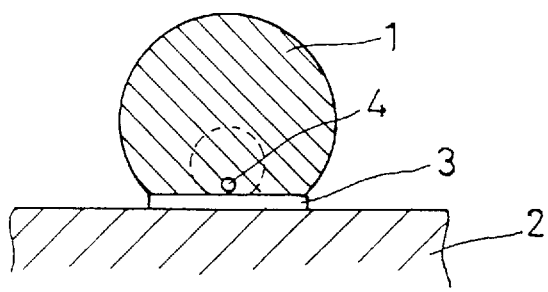
FIG. 2 is a cross-sectional view of the solder bump in a pressurizing and heating process.

FIG. 2 shows a cross-sectional view of the solder bump 1 in the pressurizing and heating process. As shown in FIG. 2, the volume of the void 4 in the solder bump 1, after the depressurizing and heating process is performed, is reduced since the pressure in the atmosphere is increased from the pressure in the depressurizing and heating process.

Specifically, the volume of the void 4 after the pressurizing and heating process is performed can be calculated by the equation V2=(P1/P2)×V1, where V1 is a volume of the void 4 after the depressurizing and heating process is performed; V2 is a volume of the void 4 after the pressurizing and heating process is performed; P1 is a pressure of the atmosphere in the depressurizing and heating process; and P2 is a pressure of the atmosphere after the pressurizing and heating process. The volume V2 after the pressurizing and heating process is performed is less than the volume V1 after the depressurizing and heating process is performed since the pressure P2 is greater than the pressure P1 (P1<P2).

After the pressurizing and heating process is completed, the pressurizing and cooling process is performed. In the pressurizing and cooling process, the solder bump 1 is cooled to be solidified while the pressurized atmosphere in the pressurizing and heating process is maintained. Thereby, the solder bump 1, which was in a melted state in the depressurizing and heating process and also in the pressurizing and heating process, is solidified.

Figure 3:
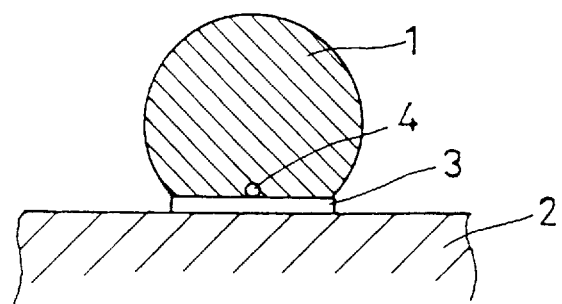
FIG. 3 is a cross-sectional view of the solder bump in a pressurizing and cooling process.
Figure 4A:
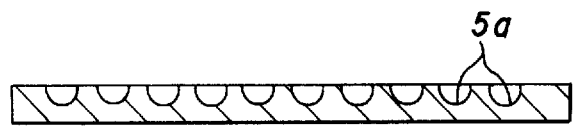
FIG. 4 is an illustration for explaining a placing process for forming solder bumps on a semiconductor element.
Figure 4B:
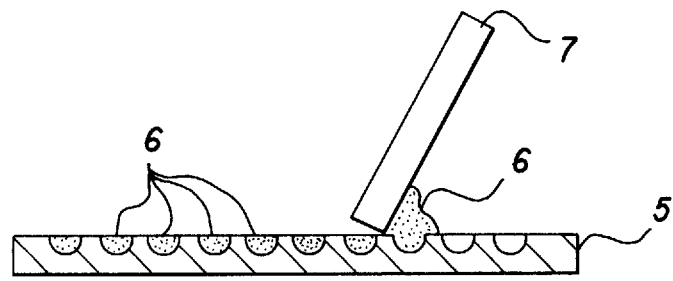
Figure 4C:
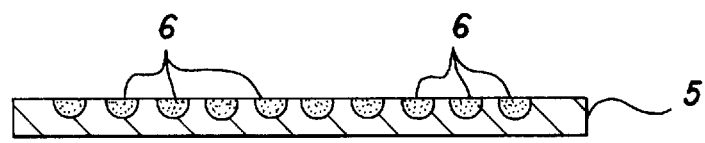
Figure 4D:
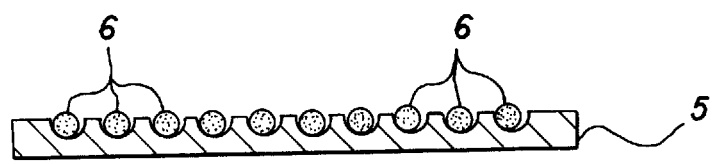
Figure 4E:
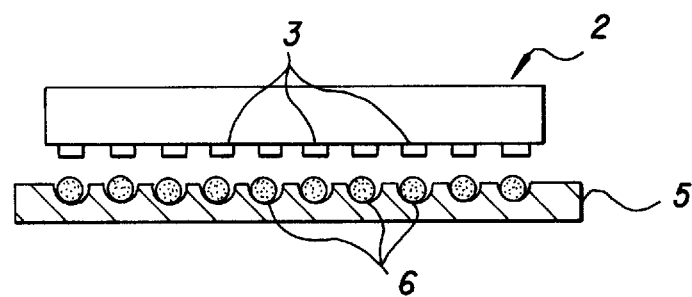
Figure 4F:
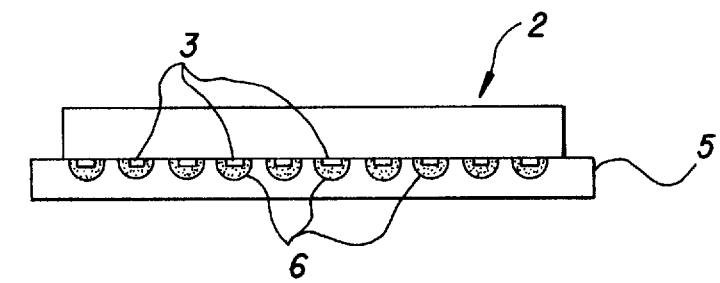

FIG. 3 is a cross-sectional view of the solder bump 1 in that state. As shown in FIG. 3, the void 4 in the solder bump 1 after the pressurizing and cooling process is performed remains in a smaller volume since the pressure in the atmosphere in the pressurizing and heating process is maintained.

As mentioned above, even if the void 4 is formed in the solder bump 4, the volume of the void 4 can be decreased to be substantially zero by heating the solder bump 1 in the depressurizing atmosphere, then, heating the solder bump 1 in the pressurized atmosphere and, thereafter, cooling the solder bump 1 in the pressurized atmosphere to solidify the solder bump 1. That is, the volume of the void 4 can be reduced to a size which does not provide influence when the semiconductor device 20 is mounted to a mount board. Accordingly, a reliability of the mounting operation of the semiconductor device 20 can be increased.

A description will now be given of examples of formation of the protruding electrodes practically performed by the inventors.

EXAMPLE 1

A model wafer (semiconductor element 2) was produced which has electrodes with a pitch of 200 μm. Each of the electrodes has a diameter of 100 μm. The electrodes were electroplated by Ni with a thickness of 2 82 m so as to form the electrode pads 3. Immediately after the electrodes were electroplated, the solder bumps 1 were formed by electroplating Pb-5 wt % Sn with a thickness of 50 μm. Then, the electroplated material was annealed. This process corresponds to the placing process.

When the above-mentioned process was completed, the inside of the solder bumps 1 was checked by a transmission X ray apparatus. The voids 4 having a large volume were found in the solder bumps 1 although the solder bumps 1 were annealed.

Thereafter, the solder bumps 1 were heated at 380° C. for 5 minutes under a depressurized condition of 0.02 torr so as to melt the solder bumps 1. This process corresponds to the depressurizing and heating process. Then, N₂ gas was supplied to the chamber 11 so as to pressurize the chamber 11 to a normal pressure while the temperature in the chamber 11 was maintained substantially equal to the temperature in the depressurizing and heating process. This process corresponds to the pressurizing and heating process. It should be noted that the temperature of the atmosphere was temporarily decreased to 350° C. when this process was performed, but the temperature was raised to 380° C. in a short time. Thereafter, the solder bumps 1 were maintained for 5 minutes under the normal pressure so as to cool and solidify the solder bumps 1. This process corresponds to the pressurizing and cooling process.

After the above-mentioned processes were completed, the inside of the solder bumps 1 was observed by the transmission X-ray apparatus. It was found that the void 4 in each of the solder bumps 1 was substantially eliminated (shrunk). It was recognized from the result that the void 4 can be substantially eliminated by melting the solder bump 1 under the depressurized condition; thereafter pressurizing the atmosphere while melted; and finally solidifying the solder bump 1.

Figure 8:
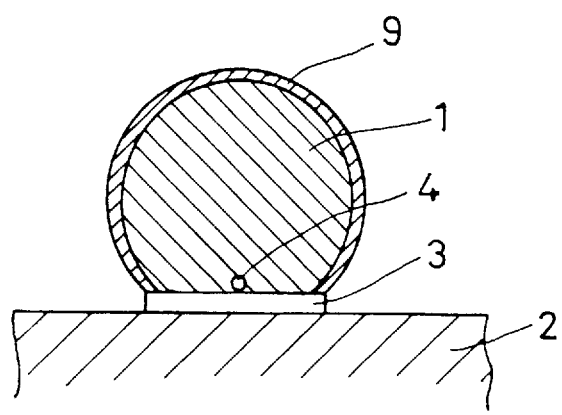
FIG. 8 is a cross-sectional view of the solder bump on which an oxidation film is formed.

A description will now be given of a second example of the forming process of the protruding electrode perform by the inventors. As is known, an oxidation film 9 is formed on a surface of the solder bump 1 as shown in FIG. 8 when the solder bump 1 is subjected to a heating process. In the second example, a process is added to the process of the above-mentioned example 1 for removing the oxidation film 9 formed on the solder bump 1.

EXAMPLE 2

Similar to the example 1, a model wafer (semiconductor element 2) was produced which has electrodes with a pitch of 200 μm. Each of the electrodes has a diameter of 100 μm. The electrodes were electroplated by Ni with a thickness of 2 μm so as to form the electrode pads 3. Thereafter, the solder bumps 1 were formed by electroplating Pb-5 wt % Sn with a thickness of 50 μm. Then, the electroplated material was annealed. This process corresponds to the placing process.

When the above-mentioned process was completed, the inside of the solder bumps 1 was checked by a transmission X-ray apparatus. The voids 4 having a large volume were found in the solder bumps 1 although the solder bumps 1 were annealed.

Thereafter, the solder bumps 1 were heated in the $N_2$ atmosphere (normal pressure) at 380° C., and a flux was applied to the solder bumps 1 and heated at 350° C. so as to remove the oxidation film. Then, the inside of the solder bumps 1 was observed by the transmission X ray apparatus. The rate of generation of the void 4 was 17.9%.

Then, the solder bumps 1 were further heated at 380° C. for 5 minutes under a depressurized condition (0.02 torr) so as to melt the solder bumps 1. $N_2$ gas was supplied while the solder bumps 1 were melted, and heated at 380° C. for 5 minutes in the normal pressure condition. Thereafter, the inside of the solder bumps 1 was observed by the transmission X-ray apparatus. The rate of generation of the void 4 was decreased to as low as 4.4%.

As mentioned above, it has been proven that the rate of generation of the void 4 was reduced by the embodiment according to the present invention. Particularly, by removing the oxidation film 9 formed on the solder bump 1 as performed in the example 2, bonding of the semiconductor element 2 to the mount board can be performed in a good condition so as to eliminate bad bonding.

Figure 6:
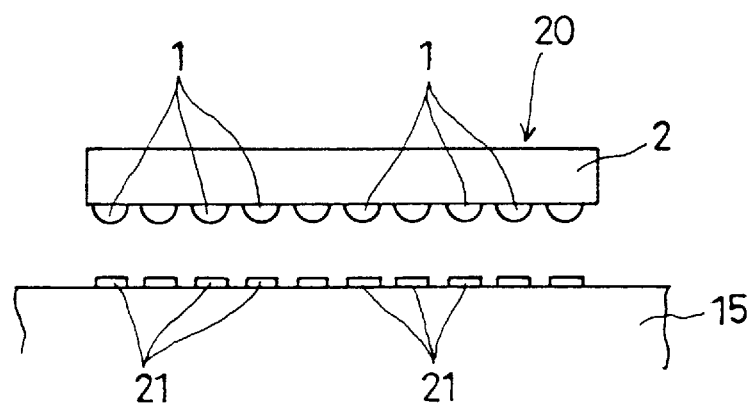
FIG. 6 is an illustration for explaining a process for mounting a semiconductor device to a mount board.

A description will now be given of an embodiment of a mounting method for mounting the semiconductor device 20 to a mount board. FIG. 6 shows a state where the semiconductor device 20 is being mounted to a mount board 15.

The mount board 15 is a circuit board made of ceramic or plastic. A mounting surface of the mount board is provided with electrodes 21 and a wiring pattern (not shown in the figure). The electrodes 21 and the wiring pattern are formed of, for example, copper (Cu). A surface layer is formed on the electrodes 21.

The semiconductor device 20 is positioned above the mount board 15 so that the solder bumps 1 are opposite to the corresponding electrodes 21. Then, the semiconductor device 20 is moved toward the mount board 15 so as to bring the solder bumps 1 into contact with the corresponding electrodes 21. Thereafter, a heating process is performed so as to bond the solder bumps 1 and the electrodes 21.

In the present embodiment, The surface layer on the electrodes 21 is formed by nickel (Ni) or platinum (Pt). By forming the surface layer by nickel (Ni) or platinum (Pt), diffusion of the solder material into the electrode material can be prevented. The reason for this will be described below with reference to FIGS. 9A–9C.

Figure 9A:
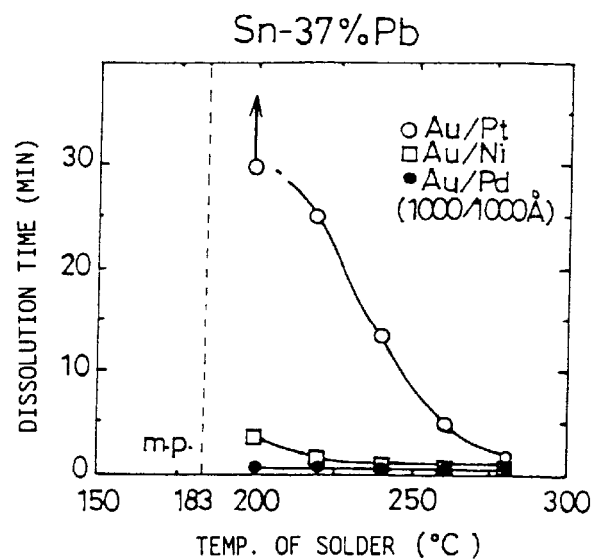
FIGS. 9A is a graph indicating a relationship between a temperature of solder and a dissolution time of the solder formed of Sn-37 wt % Pb into an electrode formed of various materials.
Figure 9B:
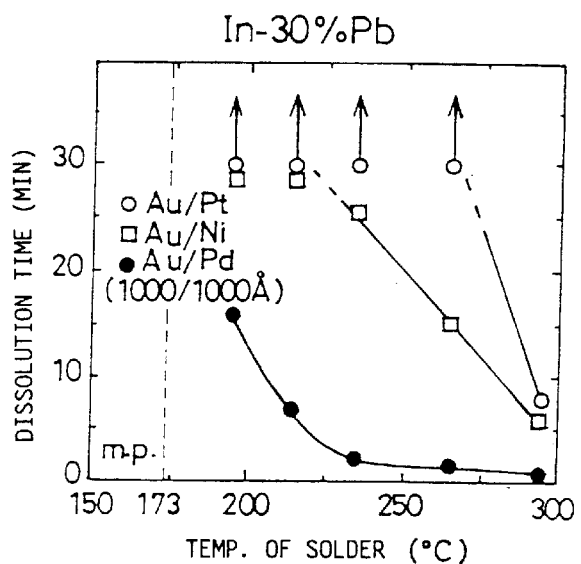
FIGS. 9B is a graph indicating a relationship between a temperature of solder and a dissolution time of the solder formed of In-30 wt % Pb into an electrode formed of various materials.
Figure 9C:
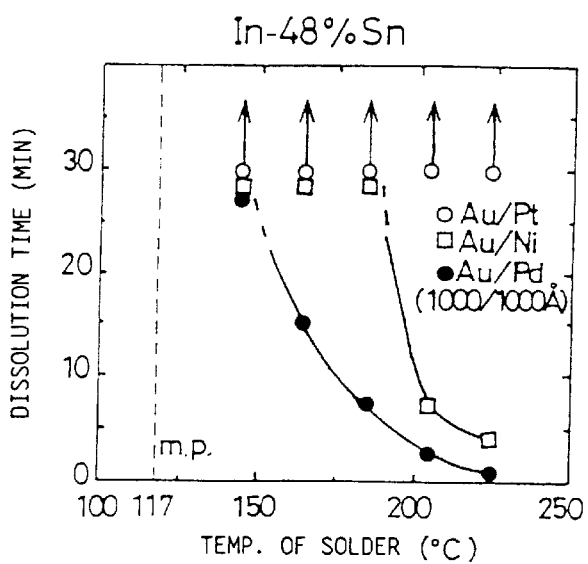
FIGS. 9C is a graph indicating a relationship between a temperature of solder and a dissolution time of the solder formed of In-48 wt % Pb into an electrode formed of various materials.

FIGS. 9A–9C show the results of tests for measuring a penetration time for various temperatures of the solder. In the tests, the solder bumps 1 were formed by Sn-37 wt % Pb (FIG. 9A), In-30 wt % Pb(FIG. 9B) and In-48 wt % Sn (FIG. 9C). The electrodes 21 were formed by nickel (Ni), platinum (Pt) and palladium (Pd).

The results of tests shown in FIGS. 9A–9C are obtained for the electrodes 21 which are provided with a gold (Au) film having a thickness of 1000 Angstroms so as to increase wettability with respect to the solder. In the figures, upward arrows (↑) indicate that no diffusion occurs after 30 minutes.

From each figure, it is appreciated that diffusion is suppressed when nickel (Ni) or platinum (Pt) is used for the surface layer. Thus, diffusion of the solder material of the solder bump 1 into the electrodes 21 can be suppressed by using nickel (Ni) or platinum (Pt) for the surface layer of the electrodes 21. Accordingly, deterioration of the electrodes 21 and the wiring connected to the electrodes 21 can be prevented. Additionally, formation of a metal compound which may be a cause of fracture of the wiring can be prevented.

In order to achieve the above-mentioned effect, a process for forming the surface layer on the electrodes 21 is required. The surface layer forming process can be achieved by electroplating the electrodes 21 by nickel (Ni) or platinum (Pt).

In the present embodiment, the above-mentioned protruding electrode forming process and the surface layer forming process are achieved by consecutive electroplating processes. That is, the mounting method according to the present embodiment is partially overlapped with the manufacturing process of the semiconductor device.

Since the protruding electrode forming process and the surface layer forming process are consecutively performed, oxidation of the surface of the electrodes 21 can be reduced. Thus, good wettability can be provided between the electrodes 21 and the solder bumps 1 in the subsequent bonding process (including heating process). This may also reduce generation of the void 4.

It should be noted that the present invention is not limited to the specifically disclosed materials in the above-mentioned embodiments. Additionally, in the above-mentioned embodiment, a so-called dimple plate is used for forming the solder bump. However, the solder bump may be formed by other methods such as an electroplating method or vapor deposition and transfer method while the effects of the above-mentioned embodiment are achieved.

The present invention is not limited to the specifically disclosed embodiments, and variations and modifications may be made without departing from the scope of the present invention.

What is claimed is:

1. A method for manufacturing a semiconductor device including a protruding electrode manufacturing process for manufacturing a protruding electrode which protrudes from a semiconductor element, said protruding electrode manufacturing process comprising:

a placing process for placing a material on said semiconductor element, said material being formed into said protruding electrode;

a depressurizing and heating process for heating said protruding electrode material in a depressurized atmosphere so as to melt said protruding electrode;

a pressurizing and heating process, subsequent to said depressurizing and heating process, for heating said protruding electrode material in a pressurized atmosphere which provides a pressure greater than a pressure in said depressurized atmosphere; and a pressurizing and cooling process, subsequent to said pressurizing and heating process, for cooling said protruding electrode material so as to solidify said protruding electrode material while said pressurized atmosphere is maintained.

2. The method for manufacturing a semiconductor device as claimed in claim 1, wherein said protruding electrode material is a solder so that a solder bump is formed as said protruding electrode.

3. The method for manufacturing a semiconductor device as claimed in claim 1, wherein said placing process includes:

a forming process for forming said protruding electrode material on a plate which is made of a material having low bondability with said protruding electrode material; and a transferring process for transferring said protruding electrode material from said plate to said semiconductor element by heating said protruding electrode material while said protruding electrode material is brought into contact with said semiconductor element.

4. The method for manufacturing a semiconductor device as claimed in claim 1, further comprising an oxidation film removing process for removing an oxidation film formed on said protruding electrode, said oxidation film removing process being preformed before said semiconductor device is bonded to a circuit board.

5. The method for manufacturing a semiconductor device as claimed in claim 1, wherein said semiconductor element includes an electrode on which said material of said protruding electrode is placed by electroplating said material, said electrode of said semiconductor element having a surface layer formed by electroplating, said material of said protruding electrode and said surface layer being electroplated in consecutive electroplating processes.

6. The method for manufacturing a semiconductor device as claimed in claim 5, wherein said surface layer is formed by one of nickel or platinum.

7. A method for mounting a semiconductor device to a mount board having an electrode formed thereon, comprising:

a protruding electrode manufacturing process for manufacturing a protruding electrode which protrudes from a semiconductor element, said protruding electrode manufacturing process comprising:

a placing process for placing a material on said semiconductor element, said material being formed into said protruding electrode;

a depressurizing and heating process for heating said protruding electrode material in a depressurized atmosphere so as to melt said protruding electrode;

a pressurizing and heating process, subsequent to said depressurizing and heating process, for heating said protruding electrode material in a pressurized atmosphere which provides a pressure greater than a pressure in said depressurized atmosphere; and a pressurizing and cooling process, subsequent to said pressurizing and heating process, for cooling said protruding electrode material so as to solidify said protruding electrode material while said pressurized atmosphere is maintained, said method for mounting a semiconductor device further comprising:

a surface layer forming process for forming a surface layer on a surface of said electrode formed on said mount board.

8. The method for mounting a semiconductor device as claimed in claim 7, wherein said surface layer is formed by one of nickel or platinum.

* * * * *